United States Patent
Kim

(10) Patent No.: US 7,061,087 B2
(45) Date of Patent: Jun. 13, 2006

(54) MULTI-PACKAGE STACK MODULE

(75) Inventor: Jin-Ho Kim, Kyungki-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 321 days.

(21) Appl. No.: 10/678,412

(22) Filed: Oct. 2, 2003

(65) Prior Publication Data

US 2004/0090759 A1 May 13, 2004

(30) Foreign Application Priority Data

Oct. 24, 2002 (KR) ............. 10-2002-0065210

(51) Int. Cl.
*H01L 23/538* (2006.01)

(52) U.S. Cl. .................. 257/686; 257/723; 361/803

(58) Field of Classification Search .............. None
See application file for complete search history.

(56) References Cited

U.S. PATENT DOCUMENTS

| | | | |
|---|---|---|---|
| 5,598,033 A * | 1/1997 | Behlen et al. .............. 257/686 |
| 6,014,313 A | 1/2000 | Hesselbom | |
| 6,239,496 B1 * | 5/2001 | Asada ..................... 257/777 |
| 6,388,333 B1 * | 5/2002 | Taniguchi et al. ........... 257/777 |
| 6,781,241 B1 * | 8/2004 | Nishimura et al. ......... 257/777 |

FOREIGN PATENT DOCUMENTS

| | | |
|---|---|---|
| JP | 2001-118983 | 4/2001 |
| KR | 2002-55573 | 7/2002 |

OTHER PUBLICATIONS

English Language of abstract for Korean Patent Publication No. 2002-55573, filed Jul. 9, 2002.
English Language of abstract for Japanese Patent Publication No. 2001-118983, filed Apr. 27, 2001.

* cited by examiner

*Primary Examiner*—John B. Vigushin
(74) *Attorney, Agent, or Firm*—Marger Johnson & McCollom, P.C.

(57) ABSTRACT

A multi-package module comprises a plurality of stacked packages including an upper package and a lower package. Each package comprises a board having located on a first side thereof a chip installation area and a bump pad area; at least one chip disposed in the chip installation area; a plurality of redistribution patterns formed on the board and electrically connected to the chip; and a plurality of first bump pads formed in the bump pad area which are electrically connected to the redistribution patterns. The respective packages are electrically connected by connecting bump pads of the upper package to bump pads of the lower package. Further, the chip installation area of the upper and lower packages not being in vertical alignment with each other.

17 Claims, 3 Drawing Sheets

MULTI-PACKAGE STACK MODULE

CROSS REFERENCE TO RELATED APPLICATIONS

The present application claims priority from Korean Patent Application No. 2002-65210 filed Oct. 24, 2002, the contents of which are incorporated herein by reference.

BACKGROUND OF THE INVENTION

1. Field of the Invention

The present invention relates to an electronic module, and more particularly, to a multi-package stack module made by stacking a plurality of semiconductor packages.

2. Description of the Related Art

The electronic industry continues to seek products that are lighter, faster, smaller, multi-functional, more reliable and more cost-effective. In order to meet the requirement of the electronic industries, circuit chips must become highly integrated.

However, it is expensive and there are technical limitations to enhancing the density of integration of chips. Therefore, 3-D type semiconductor packaging technologies have been developed and used in order to overcome the above-mentioned problems. In general, a multi-package module made by stacking a plurality of packages in a module is known.

In order to manufacture a multi-package module by using conventional ball grid array type packages, additional electrical connecting means need to be inserted between packages, because the conductive bumps are formed entirely on the rear side of each board and can induce structural mismatch with the chip of the package beneath.

Therefore, the packages in which bump pads are formed in the area peripheral to the chip installation area are usually used for manufacturing multi-package modules as shown in FIG. 1 and FIG. 2.

FIG. 1 is a plan view of a conventional package used in a multi-package module. FIG. 2 is a sectional view of a conventional multi-package module made by stacking a plurality of the conventional packages shown in FIG. 1. The conventional package of FIGS. 1 and 2 comprises a board (140), a chip (112) disposed on the board, a plurality of redistribution patterns (143) formed on the board, a plurality of first bump pads (144) and a plurality of second bump pads (145). The first bump pad (144) is electrically connected to one end of each redistribution pattern (143). The other end of the redistribution patterns (143) is electrically connected to the chip (112). The second bump pads (145) are formed on the rear side of the board (140) and are electrically connected to the first bump pads (144) through via-holes (146). In general, a plurality of bonding pads (114) are formed on the chip (112), and the bonding pads (114) are electrically connected to the redistribution patterns (143) by bonding wires (116). The chip (112) and the bonding wires (116) are usually encapsulated by a resin (160), such as epoxy molding compound (EMC), in order to protect the chip 112 from the adverse effects of the external environment. Solder bumps (170) are usually formed on the second bump pads (145). The solder bumps (170) are used for electrical connection between respective packages.

A plurality of the packages are stacked to form a multi-package stack module (100) as shown in FIG. 2. The stacked packages are electrically connected to each other by the solder bumps (170).

In the conventional multi-package module (100), the chips (112) which are placed in the stacked packages (100) are vertically aligned one with the other. This configuration is employed because the chip installation areas of the stacked packages are all identical. Therefore, each chip (112) is affected not only by the heat it generates, but is also affected by the heat generated by the upper and lower adjacent chips. In addition, the bump pads (144,145) and the solder bumps (170) must be formed in the area peripheral to the chip installation area. Therefore, the area in which the Input/Output terminals can be formed is limited.

SUMMARY OF THE INVENTION

Accordingly, the present invention has been conceived to solve the above-described problems.

In one embodiment, a multi-package module according to the present invention comprises a plurality of stacked packages. Each of the stacked packages comprises a board, at least one chip, a plurality of redistribution patterns, a plurality of first bump pads, a plurality of second bump pads and via holes. The board may be composed of a chip installation area and a bump pad area. The chip may be disposed in the chip installation area, and the first bump pads may be formed in the bump pad area. The first bump pads are electrically connected to the chip through the redistribution patterns formed on the board. The second bump pads may be formed on the rear side of the board, and preferably on the rear side of the chip installation area. The second bump pads are electrically connected to the redistribution patterns. In the multi chip module made by stacking a plurality of the above-described packages, each of the packages is electrically connected to the adjacent packages through electrical connectors such as solder bumps disposed between the second bump pads of the upper package and the first bump pads of the lower package. The chip installation areas of the adjacent packages are not in vertical alignment with each other.

Preferably, each package may comprise an encapsulation part protecting the chip from the external environment. More preferably, the height of the solder bumps may be similar to the heights of the encapsulation parts.

Preferably, the second bump pads may be formed on the entire rear side of the board of the lowest stacked package.

Preferably, at least one electronic device may be disposed on the board of the highest stacked package, and electrically connected to the second bump pads of the highest stacked package.

According to another embodiment, a multi-package module comprises a plurality of stacked packages including an upper package and a lower package. Each package has a board having located on a first side thereof a chip installation area and a bump pad area. At least one chip is disposed in the chip installation area chip. A plurality of first bump pads are formed in the bump pad area electrically connected to chip. The respective packages are electrically connected by connecting bump pads of the upper package to bump pads of the lower package. The chip installation area of the upper and lower packages are laterally offset from each other.

BRIEF DESCRIPTION OF THE DRAWINGS

The above and the other aspects and advantages of the present invention will become more apparent by describing in detail preferred embodiments thereof with reference to the attached drawings, in which.

DETAILED DESCRIPTION OF THE PREFERRED EMBODIMENT

Figure 1:
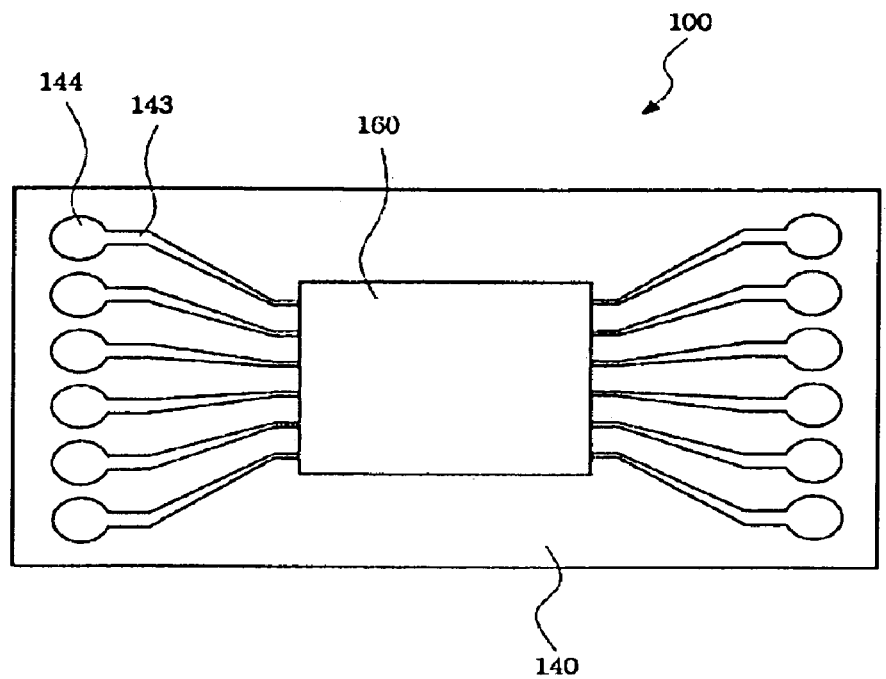
FIG. 1 is a plan view of the conventional ball grid array package used for manufacturing a multi-package module.
Figure 2:
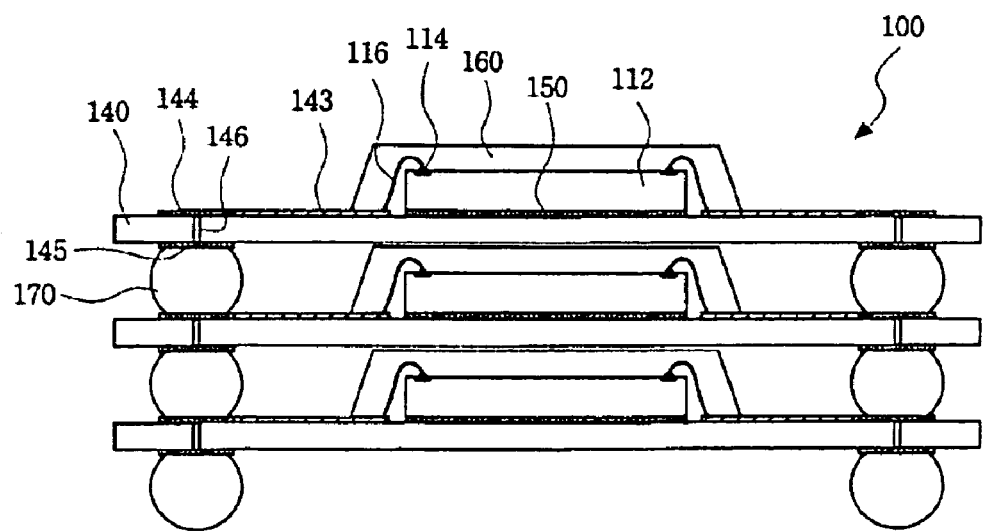
FIG. 2 is a sectional view of the conventional multi-package module made by using the packages described in FIG. 1.
Figure 3:
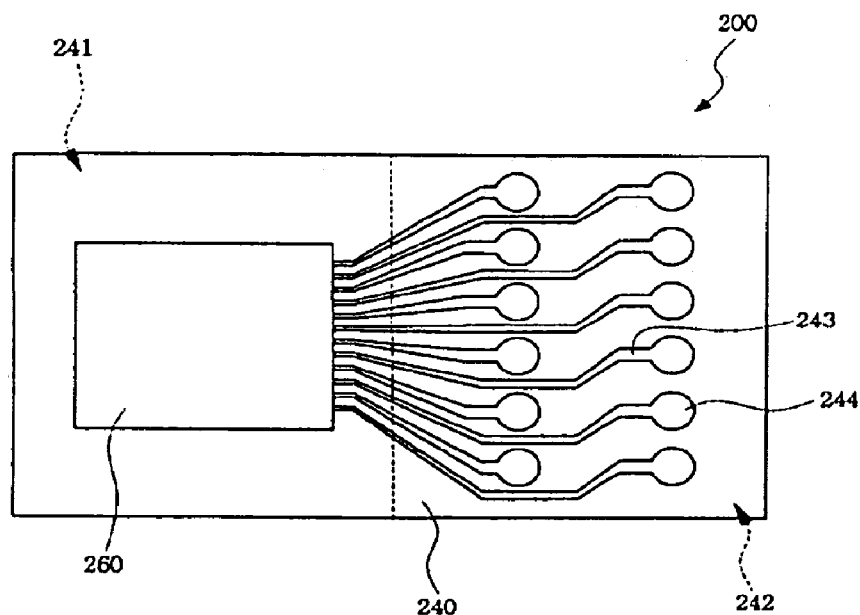
FIG. 3 is a plan view of the ball grid array package used for manufacturing a multi-package module according to an aspect of the present invention.
Figure 4:
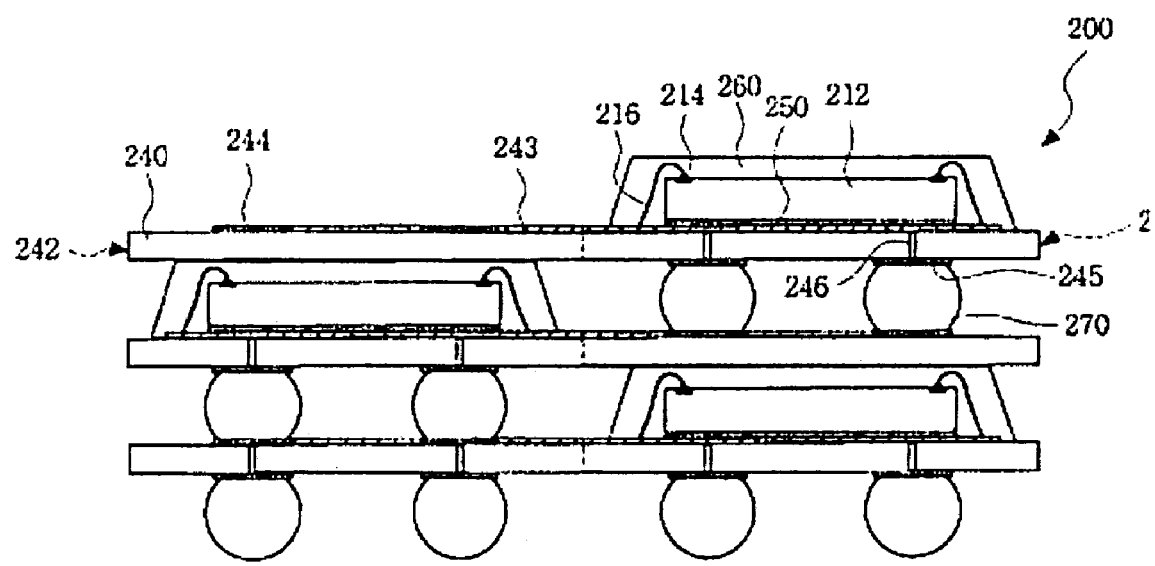
FIG. 4 is a sectional view of the multi-package module according to a first embodiment of the present invention.

The preferred embodiment of the present invention will be described referring to FIG. 3 through FIG. 6. The structure of the package used for the multi-package module of the present invention will be described referring to FIG. 3 and FIG. 4. As shown in FIG. 3 and FIG. 4, a chip (212) is disposed on a side portion of a board (240) rather than a center portion of the board (240). The portion of the board (240) on which the chip (212) is disposed is hereinafter referred to as a chip installation area (241). The chip (212) may be attached to the chip installation area (241) by adhesives such as an epoxy. First bump pads (244) are formed on the remaining portion of the board (240) which is located outside the chip installation area (241). The portion of the board (240) wherein the first bump pads (244) are formed is hereinafter referred to as a bump pad area (242). Because the chip (212) is disposed on a side portion of the boards (240), the first bump pads (244) need not be located on the peripheral portion of the board (240). More specifically, the bump pad area (242) can occupy up to the full extent of the remaining portion of the board (240). In FIG. 3, the chip installation area (241) is positioned on about one half of a first side of the board (240), and the bump pad area (242) is positioned on about the other half of the first side of the board (240).

The first bump pads (244) are electrically connected to the redistribution patterns (243). Second bump pads (245) are formed on the second side of the board (240), and are electrically connected to the redistribution patterns (243) through via holes (246). Specifically, as shown in FIG. 4, the second bump pads (245) are formed on the second side of the boards (240) in the space corresponding to the chip installation area (241). A conductive bump such as a solder bump (270) is formed on each second bump pad (245).

Generally, bonding pads (214) are formed on the chip (212), and are electrically connected to the redistribution patterns (243) by electrical connectors such as bonding wires (216). The chip (212) and the bonding wires (216) are generally encapsulated by a member formed of a resin (260), such as EMC, in order to be protected from the adverse effects of the external environment.

A multi-package module (200) according to a first embodiment of the present invention will be described referring to FIG. 4. As shown in FIG. 4, packages such as those described in the FIG. 3 are stacked in a manner such that chips (212) of the stacked packages are not in vertical alignment with each other. In other words, the chips (212) of the stacked packages are laterally offset from each other. Preferably, the chips (212) do not overlap with each other.

The solder bumps (270) of the upper package are electrically connected to the first bump pads (244) formed on the bump pad area (242) of the lower adjacent package. Because the solder bumps (270) are formed on the second side of the board (240) in a space corresponding to the chip installation area (241), the chip installation area (241) of the upper package becomes positioned above the bump pad area (242) of the lower packages. Therefore, the chip installation area (241) of the two adjacent stacked packages are not in vertical alignment with each other. Preferably, the second bump pads (245) and the solder bumps (270) are formed on the second side of the board (240) of the lowest stacked package.

Figure 5:
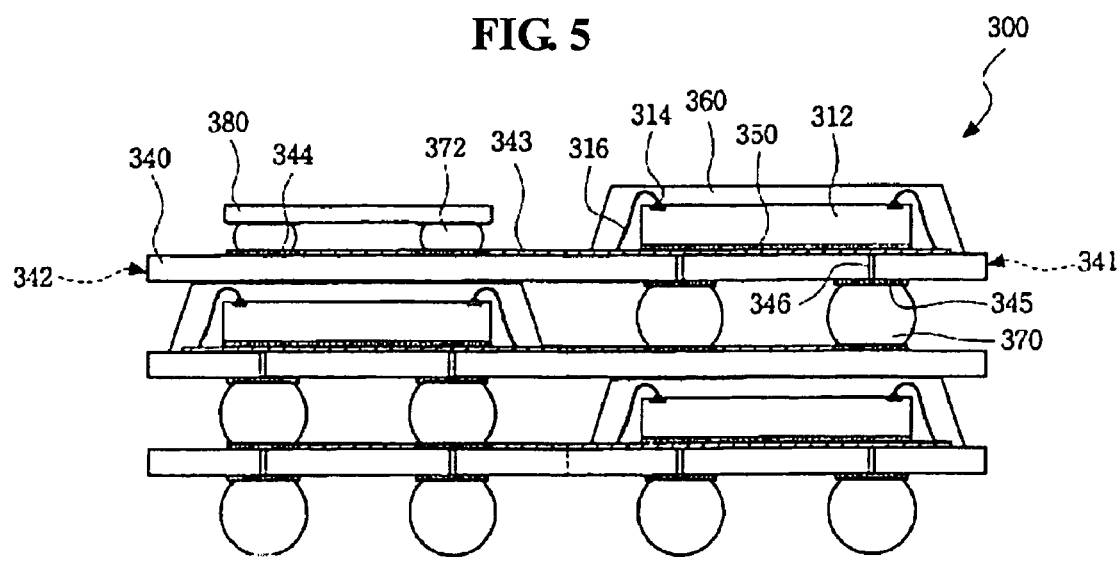
FIG. 5 is a sectional view of the multi-package module according to a second embodiment of the present invention.

FIG. 5 is a sectional view of a multi-package module (300) according to a second embodiment of the present invention. The basic structure of the multi-package module (300) is the same as that of the multi-package module (200) except for an additional electronic device (380) disposed on the bump pad area (342) of the highest package of the multi-package module (300).

The electronic device (380) may be a capacitor, an inductor, a resistor, or other electronic elements. Although one electronic device (380) is described in FIG. 5, a plurality of electronic devices can be disposed on the bump pad area (342). Preferably, the electronic device (380) is electrically connected to the first bump pad (344).

Figure 6:
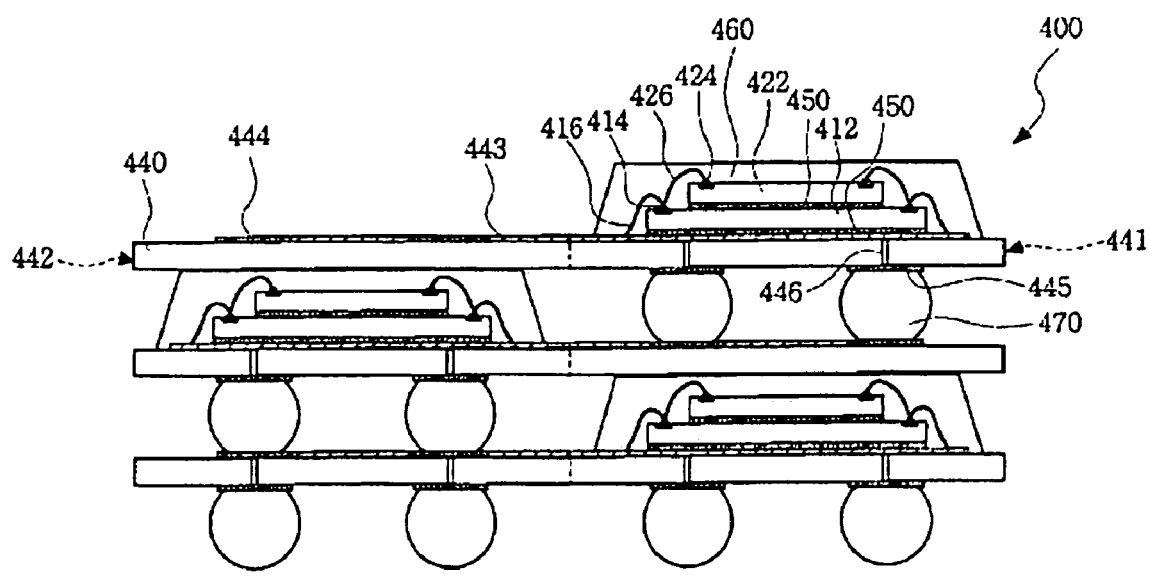
FIG. 6 is a sectional view of the multi-package module according to a third embodiment of the present invention.

FIG. 6 is a sectional view of a multi-package module (400) according to a third embodiment of the present invention. The basic structure of the multi-package module (400) is the same as that of the multi-package module (200) except that at least one package is a multi-chip package. As shown in FIG. 6, at least two chips (412, 422) are stacked in a package and the two chips (412, 422) are electrically connected to redistribution patterns (443) by bonding wires (416, 426) and to bump pads (444, 445) by redistribution patterns (443). The number of chips employed can be determined according to their usage.

The multi-package module structure described in the specification can also be adapted to the system-in module including a memory, central processing units (CPUs), and other electronic devices in a single module.

Because of the configuration of the multi-package module described in the embodiments of FIGS. 3–6, it is possible to prevent chips in one location in a stacked package from being affected by the heat generated by chips of another adjacent stacked packages. In addition, it is possible to enhance the freedom of designing input/output terminals, because the bump pads need not be formed in the area peripheral to the chip installation area.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A multi-package module comprising a plurality of stacked packages including an upper package and a lower package, each package comprising:

a board having located on one side thereof a chip installation area and a bump pad area;

at least one chip disposed in the chip installation area; and a plurality of first bump pads formed in the bump pad area electrically connected to the chip, wherein the respective packages are electrically connected by connecting bump pads of the upper package to bump pads of the lower package, the chip installation area of the upper and lower packages being laterally offset from each other, wherein a plurality of second bump pads are formed on a second side of the board, and a plurality of via holes through which the second bump pads are electrically connected to redistribution patterns, and wherein the second bump pads are formed on the second side of the board in the space corresponding to the chip installation area on the first side of the board.

2. A multi-package module comprising a plurality of stacked packages including an upper package and a lower package, each package comprising:
- a board having located on a first side thereof a chip installation area and a bump pad area;
- at least one chip disposed in the chip installation area;
- a plurality of redistribution patterns formed on the board and electrically connected to the chip;
- a plurality of first bump pads formed in the bump pad area which are electrically connected to the redistribution patterns;
- a plurality of second bump pads formed on a second side of the board; and
- a plurality of via holes through which the second bump pads are electrically connected to the redistribution patterns, wherein the respective packages are electrically connected by connecting the second bump pads of the upper of two adjacent packages to the first bump pads of the lower package, the chip installation area of the upper and lower packages not being in vertical alignment with each other, the chip installation area being positioned on about one half of the first side of the board, and the bump pad area being positioned on about the other one half of the first side of the board.

3. A multi-package module according to claim 2, wherein the second bump pads are formed on the second side of the board in the space corresponding to the chip installation area on the first side of the board.

4. A multi-package module according to claim 2, wherein conductive bumps are provided on the second bump pads for electrically connecting the second bump pads of the upper of two adjacent packages to the first bump pads of the lower package.

5. A multi-package module according to claim 4, wherein a portion of the conductive bumps of any two adjacent packages are not in vertical alignment with each other.

6. A multi-package module according to claim 2, which further includes an encapsulation member surrounding the chip for protecting the chip from the external environment.

7. A multi-package module according to claim 6, wherein conductive bumps are provided having similar heights to the height of the encapsulation member.

8. A multi-package module according to claim 2, wherein the second bump pads are formed on substantially the entire second side of the board of the lower package.

9. A multi-package module according to claim 2, further comprising at least one electronic device is disposed on the board of the upper package, and electrically connected to the first bump pads of the upper package.

10. A multi-package module comprising a plurality of stacked packages including an upper package and a lower package, each package comprising:
- a board having located on a first side thereof a chip installation area and a bump pad area;
- at least one chip disposed in the chip installation area;
- a plurality of redistribution patterns formed on the board and electrically connected to the chip; and
- a plurality of first bump pads formed in the bump pad area which are electrically connected to the redistribution patterns, wherein the respective packages are electrically connected by connecting bump pads of the upper package to bump pads of the lower package, the chip installation area of the upper and lower packages not being in vertical alignment with each other, wherein a plurality of second bump pads are formed on a second side of the board, and a plurality of via holes through which the second bump pads are electrically connected to the redistribution patterns, and wherein the second bump pads are formed on the second side of the board in the space corresponding to the chip installation area on the first side of the board.

11. A multi-package module according to claim 10, which further includes an encapsulation member surrounding the chip for protecting the chip from the external environment.

12. A multi-package module according to claim 11, wherein conductive bumps are provided having similar heights to the height of the encapsulation member.

13. A multi-package module according to claim 10, wherein the chip installation area is positioned on about one half of the first side of the board, and the bump pad area is positioned on about the other one half of the first side of the board.

14. A multi-package module according to claim 10, wherein at least one electronic device is disposed on the board of the upper package, and is electrically connected to the first bump pads of the upper package.

15. A multi-package module according to claim 10, wherein the packages are electrically connected by connecting the second bump pads of the upper of two adjacent packages to the first bump pads of the lower package.

16. A multi-package module according to claim 10, wherein conductive bumps are provided on the second bump pads for electrically connecting the second bump pads of the upper package to the first bump pads of the lower package.

17. A multi-package module according to claim 10, wherein the second bump pads are formed on substantially the entire second side of the board of the lower package.

* * * * *